United States Patent
Park

(10) Patent No.: US 7,663,313 B2
(45) Date of Patent: *Feb. 16, 2010

(54) ORGANIC ELECTROLUMINESCENT DISPLAY DEVICE WITH POROUS MATERIAL LAYER

(75) Inventor: Jin-Woo Park, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 46 days.

This patent is subject to a terminal disclaimer.

(21) Appl. No.: 10/920,232

(22) Filed: Aug. 18, 2004

(65) Prior Publication Data

US 2005/0046338 A1   Mar. 3, 2005

(30) Foreign Application Priority Data

Aug. 27, 2003   (KR) .................... 10-2003-0059489

(51) Int. Cl.
*H01L 51/00* (2006.01)
*H05B 33/04* (2006.01)

(52) U.S. Cl. ..................... 313/512; 313/504
(58) Field of Classification Search ............... 313/504, 313/506, 512; 428/690, 917
See application file for complete search history.

(56) References Cited

U.S. PATENT DOCUMENTS

| | | | |
|---|---|---|---|
| 4,853,300 A | | 8/1989 | Pike |
| 5,124,204 A | * | 6/1992 | Yamashita et al. .......... 428/331 |
| 5,882,761 A | | 3/1999 | Kawami et al. |
| 6,013,275 A | * | 1/2000 | Konagaya et al. ............ 424/443 |
| 6,709,806 B2 | * | 3/2004 | Hotta et al. .................. 430/322 |
| 6,737,176 B1 | * | 5/2004 | Otsuki et al. ................ 428/690 |
| 6,800,350 B2 | * | 10/2004 | Van Hal et al. ............... 428/68 |
| 7,436,117 B2 | | 10/2008 | Lee et al. |
| 7,485,185 B2 | | 2/2009 | Di Lullo Arias et al. |
| 2002/0015818 A1 | * | 2/2002 | Takahashi et al. ............. 428/76 |
| 2003/0184221 A1 | * | 10/2003 | Mishima ..................... 313/512 |

(Continued)

FOREIGN PATENT DOCUMENTS

JP       05-335080       12/1993

(Continued)

OTHER PUBLICATIONS

Tsutsui et al., Doubling Coupling-Out Efficiency in Organic Light-Emitting Devices Using Thin Silica Aerogel Layer, Advanced Materials, 2001, 13 No. 15, August 3.*

(Continued)

*Primary Examiner*—Karabi Guharay
(74) *Attorney, Agent, or Firm*—Robert E. Bushnell, Esq.

(57) ABSTRACT

An Organic Electroluminescent Display (OELD) includes: a substrate, an organic electroluminescent unit arranged on a surface of the substrate and having a pair of opposing electrodes and an organic emissive layer emitting light due to recombination of electrons and holes supplied from the pair of electrodes, a sealing member combined with the substrate to protect the organic electroluminescent unit from external air and having a sealing portion along its edge, and a porous material layer arranged on a surface of the sealing member opposite to the organic electroluminescent unit so as not to contact the sealing portion, the porous material layer including a transparent material adapted to absorb moisture and remain transparent even after absorption of moisture.

26 Claims, 2 Drawing Sheets

U.S. PATENT DOCUMENTS

2005/0046345 A1     3/2005   Park
2009/0018250 A1     1/2009   Carcich

FOREIGN PATENT DOCUMENTS

| | | |
|---|---|---|
| JP | 10-275679 | 10/1998 |
| JP | 2001-035659 | 2/2001 |
| JP | 2001-277395 | 10/2001 |
| JP | 2002-8852 | 1/2002 |

OTHER PUBLICATIONS

U.S. Appl. No. 10/920,243, filed Aug. 2004, Jin-woo Park.
Japanese Office Action corresponding to Japanese Patent Application No. 2004-193896, issued on Feb. 27, 2007.
Chinese Office action dated on Mar. 21, 2008 for corresponding Chinese Patent Application No. 200410055949.8 (with English translation).
Changmook Kim, et al., Synthesis of Mesoporous Alumina by Using a Cost-Effective Template, Korean J. Chem. Eng., 20(6), 1142-1144 (2003).
Gianluca Paglia, Determination of the Structure of [Gamma]-Alumina Using Empirical and First Principle Calculations Combined With Supporting Exceriments, Curtin university of Technology, Feb. 2004.
Lubomir Smrcok et al., Bamma-Alumina: A Single-Crystal X-Ray Diffraction Study, Acta Crystallographica Section C: Crystal Structure Communications, C62 (9)s. i83-i84, 2006.
T.B. Reed and D.W. Breck, "Crystalline zeolite, II. Crystal Structure of Snythetic Zeolite, Type A", published on Apr. 23, 1956.

* cited by examiner

ORGANIC ELECTROLUMINESCENT DISPLAY DEVICE WITH POROUS MATERIAL LAYER

CLAIM OF PRIORITY

This application makes reference to and claims all benefits accruing under 35 U.S.C. §119 from an application for ORGANIC ELECTROLUMINESCENT DISPLAY WITH POROUS MATERIAL LAYER earlier filed in the Korean Intellectual Property Office on the 27 Aug. 2003 and there duly assigned Ser. No. 2003-59489.

Furthermore, the present application is related to co-pending U.S. application Ser. No. 10/920243, filed concurrently with this application and entitled: ORGANIC ELECTROLUMINESCENT DISPLAY WITH POROUS MATERIAL LAYER. The related application bears common inventorship with this application and claims priority under 35 U.S.C. §119 from an application for ORGANIC ELECTROLUMINESCENT DISPLAY WITH POROUS MATERIAL LAYER earlier filed in the Korean Intellectual property Office on 28 Aug. 2003 and there duly assigned Serial No. 2003-59903.

BACKGROUND OF THE INVENTION

1. Field of the Invention

The present invention relates to an organic electroluminescent display, and more particularly, the present invention relates to an organic electroluminescent display having an improved sealing structure.

2. Description of the Related Art

In general, Organic Electroluminescent Displays (OELDs) are self-luminous displays operating at a low voltage by electrically exciting a fluorescent organic compound to emit light. Since OELDs can be made thin, have a wide viewing angle, and have a rapid response rate, they are receiving great attention as a next generation display, eliminating problems arising with liquid crystal displays.

Such an organic electroluminescent display is manufactured by forming an organic layer in a predetermined pattern on a transparent insulating substrate, such as glass, and then forming electrode layers on the top and bottom surfaces thereof. In this organic electroluminescent display, holes injected from anodes migrate toward an emissive layer when an anode voltage is applied to the anode, and electrons injected from cathodes migrate toward the emissive layer when a cathode voltage is applied to the cathode, so that the holes and electrons recombine in the emissive layer to generate exitons. As these exitons transit from an exited state to a base state, luminescent molecules in the emissive layer emit light, thereby forming images.

Organic electroluminescent displays deteriorate as moisture intrudes thereinto, so that a sealing structure for preventing intrusion of moisture is required.

Conventionally, a sealing structure has been used which consists of a metal can or glass substrate formed into a cap having grooves filled with a desiccant powder. In addition, a film type desiccant has been attached using double-sided tape. The use of a desiccant powder complicates manufacturing processes, raises material and manufacturing costs, and increases the thickness of the substrate. Furthermore, due to the area filled with the desiccant powder, front emission or double-side emission, particularly when used together with a non-transparent substrate, cannot be achieved. The film type desiccant is not a perfect sealing structure preventing intrusion of moisture and is liable to be damaged in the manufacture or when used due to its poor durability and reliability. Therefore, the film type desiccant is not suitable for use on a mass scale.

U.S. Pat. No. 5,882,761 relates to an organic electroluminescent display apparatus including a stack of pairs of opposing electrodes with an emissive layer made of an organic compound therebetween, a container sealing the stack from external air, and a desiccant placed inside the container, wherein the desiccant remains in a solid state even after absorbing moisture. This patent suggests the use of an alkali metal oxide, sulfate, etc. as the desiccant. However, the organic electroluminescent display is thick due to the container. Furthermore, the desiccant becomes opaque, although it remains as a solid, after absorbing moisture, so that it cannot be applied to front emission and double-side emission displays. As described above, the manufacture of the organic electroluminescent display apparatus is complicated, and the material and manufacturing costs are high.

Japanese Laid-Open Patent Publication No. 5-335080 relates to a method of forming a protective layer in a thin, organic electroluminescent display including an emissive layer containing at least one kind of organic compound arranged between an anode and a cathode, at least one of which is transparent, the protective layer being made of amorphous silica. In particular, amorphous silica, which has a dense structure, is applied as a thick layer to a second electrode layer to prevent intrusion of moisture from the outside. However, the amorphous silica protective layer cannot absorb moisture present in the electroluminescent display, and accordingly, an additional moisture absorbing material is required.

SUMMARY OF THE INVENTION

The present invention provides an organic electroluminescent display (OELD) capable of front emission or double-side emission because it remains transparent even when moisture is absorbed.

The present invention provides an OELD with a porous material layer that does not deteriorate the adhesion of a sealing portion.

The present invention also provides an OELD with a porous material layer that is appropriately spaced from an OEL unit to prevent a Moire phenomenon.

According to an aspect of the present invention, an OELD is provided comprising: a substrate; an organic electroluminescent unit disposed on a surface of the substrate and having a pair of opposing electrodes and an organic emissive layer emitting light by recombination of electrons and holes supplied from the pair of electrodes; a sealing member combined with the substrate to protect the organic electroluminescent unit from external air and having a sealing portion along its edge; and a porous material layer disposed on a surface of the sealing member opposite to the organic electroluminescent unit so as not to contact the sealing portion and made of a transparent material which can absorb moisture and remains transparent even after moisture absorption.

According to specific embodiments of the present invention, an area of the porous material layer can be equal to or greater than the organic electroluminescent unit. A barrier wall can be further formed between the sealing portion and an edge of the porous material layer. The sealing member can have a recessed portion having a predetermined depth in the surface thereof opposite to the organic electroluminescent unit, and the porous material layer can be disposed within the recessed portion so as not to contact the sealing portion.

The sealing member can be made of a transparent substrate, and the porous material layer can be spaced a predetermined distance from the organic electroluminescent unit to prevent a Moire phenomenon induced by light emitted from the organic electroluminescent unit. The porous material layer can be spaced at least 10 μm from the organic electroluminescent unit. The porous material layer can be spaced no more than 1000 μm from the organic electroluminescent unit. The sealing member can be a glass substrate or a transparent plastic substrate. When using a transparent plastic substrate, a waterproof protective layer can be formed on an internal surface of the transparent plastic substrate. At least one of the opposing electrodes opposite to the sealing member, among the opposing electrodes of the organic electroluminescent unit, can contain a transparent conducting agent.

The porous material layer can be a porous oxide layer having a number of absorption holes. The porous oxide layer can have a thickness ranging from 100 nm to 50 μm. The absorption holes of the porous oxide layer can have a diameter ranging from 0.5-100 nm.

According to another aspect of the present invention, an OELD is provided comprising: a substrate; an organic electroluminescent unit disposed on a surface of the substrate and having a pair of opposing electrodes and an organic emissive layer emitting light by recombination of electrons and holes supplied from the pair of electrodes; a sealing member combined with the substrate to protect the organic electroluminescent unit from external air and made of a transparent material; and a porous material layer disposed on a surface of the sealing member opposite to the organic electroluminescent unit, spaced a predetermined distance from the organic emissive layer of the organic electroluminescent unit to prevent a Moire phenomenon caused by light emitted from the organic emissive layer, and made of a transparent material which can absorb moisture and remains transparent even after moisture absorption.

According to specific embodiments of the above OELD, the surface of the sealing member opposite to the organic electroluminescent display can have a recessed portion, and the porous material layer can be formed within the recessed portion. The sealing member can be made of a glass substrate, and the recessed portion can be formed by etching a surface of the glass substrate opposite to the organic electroluminescent unit. A barrier wall can be disposed between the sealing member and the substrate, and the porous material layer can be formed on the sealing member inside the barrier wall. The sealing member can be combined with the substrate by a sealing portion formed along an edge of the sealing member, and the sealing portion can include spacers that control a distance the porous material layer and the organic electroluminescent unit.

The porous material layer can be spaced at least 10 μm from the organic electroluminescent unit. The porous material layer can be spaced no more than 1000 μm from the organic electroluminescent unit.

The sealing member can be a glass substrate or a transparent plastic substrate. When using a transparent plastic substrate, a waterproof protective layer can be formed on an internal surface of the transparent plastic substrate. At least one of opposing electrodes opposite to the sealing member, among the opposing electrodes of the organic electroluminescent unit, can contain a transparent conducting agent.

The porous material layer can be a porous oxide layer having a number of absorption holes. The porous oxide layer can have a thickness ranging from 100 nm to 50 μm. The absorption holes of the porous oxide layer can have a diameter ranging from 0.5-100 nm.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Embodiments of an organic electroluminescent display (OELD) according to the present invention will be described with reference to the appended drawings.

Figure 1:
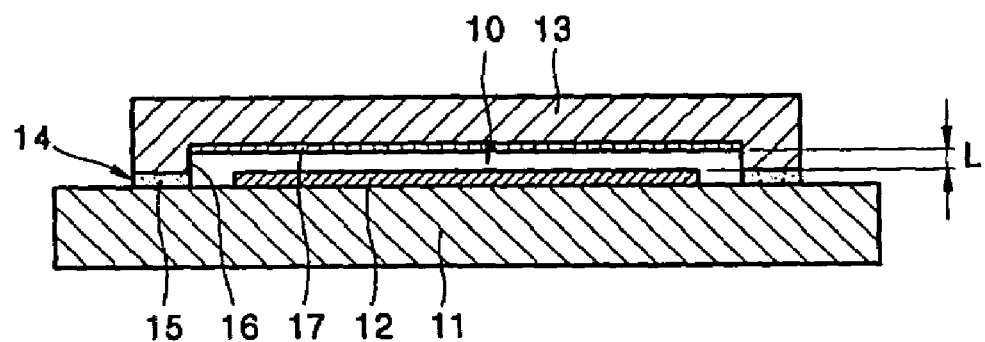
FIG. 1 is a sectional view of an organic electroluminescent display (OELD) according to an embodiment of the present invention.

Referring to FIG. 1, an OELD according to an embodiment of the present invention includes a substrate 11 made of an insulating material, an organic electroluminescent (OEL) unit 12 disposed on a surface of the substrate 11, and a sealing member 13 combined with the substrate 11 to protect the OEL unit 12 therein from external air. A porous material layer 17 is arranged on a surface of the sealing member 13 opposite to the OEL unit 12.

The substrate 11 can be made of a transparent insulating material, such as glass or a transparent plastic. The sealing member 13, which is opposite to the substrate 11 and is combined with the substrate 11, can comprise an insulating substrate, as illustrated in FIG. 1. In a rear emission display, which displays images on the substrate 11, the sealing member 13 can comprise any non-transparent element, such as a substrate or a metal cap. In a front emission display, which displays images on the sealing member 13, or in a double-side emission display, which displays images on both the substrate 11 and the sealing member 13, the sealing member 13 can be made of a transparent glass or a transparent plastic. When the sealing member 13 is made of a plastic, a waterproof protective layer (not shown) can be formed on an internal surface of the sealing member 13 to protect the OEL unit 12 from moisture. The protective layer can be made to be resistant to heat and chemicals.

The OEL unit 12 formed on the substrate 11 includes a pair of opposing electrodes, and at least one organic emissive layer arranged between the pair of electrodes. The OEL unit 12 can be either a passive matrix OEL or an active matrix OEL, which are classifications according to driving methods.

As described above, the OEL unit 12 includes an anode acting as a hole source and a cathode acting as an electron source, which are disposed opposite to each other, and an organic emissive layer. The anode, the organic emissive layer, and the cathode are sequentially formed on the substrate 11. This structure of the OEL unit 12 is for illustrative purposes only and the present invention is not limited thereto. Alternatively, the positions of the anode and the cathode can be shifted.

The anode can be made of a transparent electrode, such as an Indium Tin Oxide (ITO) electrode. In a rear emission display, which emits light toward the substrate 11, the cathode can be made of a reflective material, such as Al and/or Ca. In a front emission display, which emits light toward the sealing member 13 opposite to the substrate 11, or a double-side emission display, which emits light towards both the substrate 11 and the sealing member 13, the cathode can be formed to be transparent by forming a semi-transmissive thin layer using a metal, such as Mg and/or Ag, and depositing a transparent ITO layer thereon. In the rear emission display, an electrode closer to the substrate 11 is formed as a transparent electrode whereas an electrode closer to the sealing member 13 is formed as a reflective electrode. In the front emission display, an electrode closer to the substrate 11 is formed as a reflective electrode whereas an electrode closer to the sealing member 13 is formed as a transparent electrode.

The anode and the cathode can be formed in a predetermined pattern. In an active matrix display, the cathode can be formed as an entire layer using a blanket deposition and can also be formed in a pattern.

A low molecular weight organic layer or a high molecular weight organic layer can be formed as the organic layer interposed between the anode and the cathode. Alternatively, when a low molecular weight organic layer is used, it can be formed as a hole injection layer (HIL), a hole transport layer (HTL), an organic emission layer (EML), an electron injection layer (EIL), or an electron transport layer (ETL), having a single layered structure or a stacked composite structure. Various organic materials, for example, copper phthalocyanine (CuPc), (N,N'-di(naphthalene-1-yl)-N,N'-diphenyl-benzidine (NPB), and tris-8-hydroxyquinoline aluminum (Alq3), can be used. The low molecular weight organic layer can be formed using vacuum deposition.

When a high molecular weight organic layer is used, it can include an HTL and an EML. The HTL is made of PEDOT, and the EML is made of a high molecular weight organic material, such as polyphenylenevinylenes (PPVs) and polyflorenes. The high molecular weight organic layer can be formed using screen printing or inkjet printing.

The organic emissive layer can include red (R), green (G), and blue (B) patterns corresponding to pixels for a full color display.

In the OEL unit 12, as an anode voltage is applied to the anode and a cathode voltage is applied to the cathode, holes injected from the anode migrate into the emissive layer, and electrons migrate from the cathode into the emissive layer so that exitons are generated by recombination of the holes and the electrons in the emissive layer. As the exitons transit from an excited state to a base state, fluorescent molecules in the emissive layer emit light, forming images. A full-color OELD includes R, G, B pixels for a full color display.

In addition, an insulating protective layer (not shown), which can cover a top surface of the OEL unit 12, can be formed on an upper electrode of the OEL unit 12, which faces the sealing member 13, to provide resistance to heat, chemicals, and moisture intrusion. The protective layer can be made of a metal oxide or a metal nitride.

A space region 10 arranged between the substrate 11 and the sealing member 13 can be evacuated or filled with an inert gas, such as neon or argon. Alternatively, the space region 10 can be filled with a liquid having the same function as the inert gas.

A sealing portion 14 by which the substrate 11 and the sealing member 13 are combined together is formed along an edge of the sealing member 13 using a general sealant 15.

Although not illustrated in FIG. 1, interconnect wires, circuits, and terminals which are electrically connected to the electrodes of the OEL unit 12, are drawn out of the sealing portion 14, so that the OEL unit 12 can be driven.

According to the present invention, a porous material layer 17, which can absorb moisture, can be disposed on an internal surface of the sealing member 13 opposite the OEL unit 12. The porous material layer 17 is made of a transparent material. The porous material layer 17 can absorb moisture in the space region 10 between the substrate 11 and the sealing member 13. The porous material layer 17 remains transparent after moisture absorption. To this end, the porous material layer 17 can be made of a porous oxide including a number of absorption holes 17b, as illustrated in FIG. 2.

Figure 2:
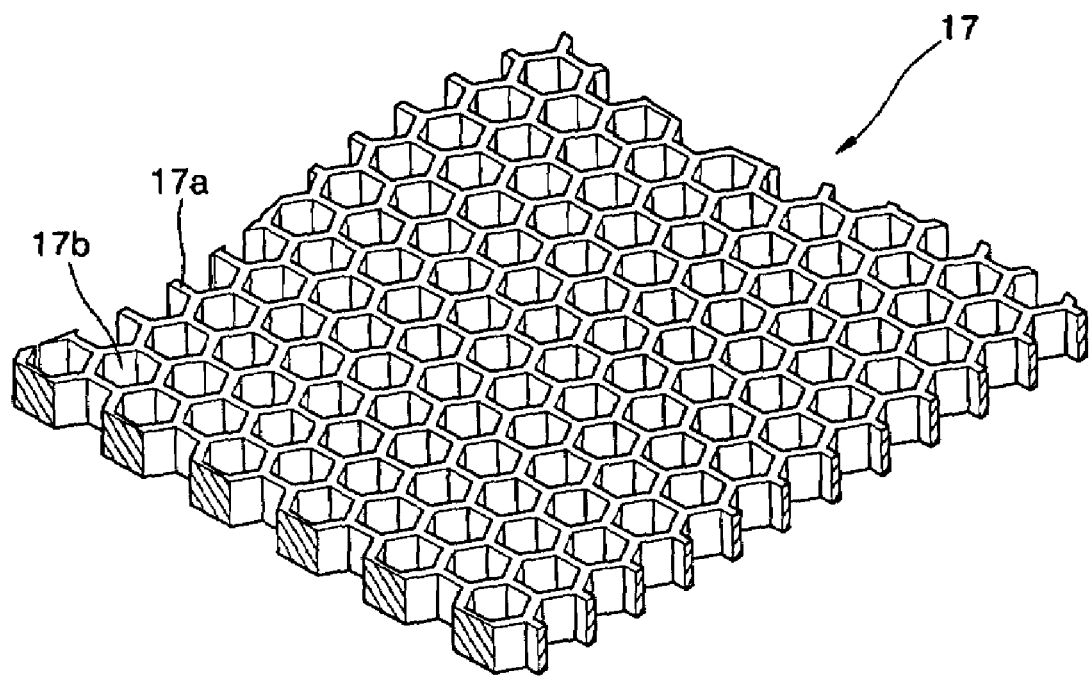
FIG. 2 is a perspective view of a porous material layer used in an OELD according to the present invention.

Referring to FIG. 2, the porous material layer 17 made of a porous oxide includes a frame 17a and a number of absorption holes 17b. The frame 17a serves as a building block forming the structure of the porous material layer 17, and the absorption holes 17b capture moisture therein.

Due to this structure, the porous material layer 17 can be transparent before and after moisture absorption, as described above.

Examples of the porous oxide that can be used for the porous material layer 17 include: porous silica; hydrated amorphous alumina; a binary compound of porous silica and hydrated amorphous alumina; a binary or higher compound including hydrated amorphous alumina and at least one of alkali metal oxide, alkali earth metal oxide, a metal halogen compound, metal sulfate, and metal perchlorinate; and a ternary or higher, multi-compound including hydrated amorphous alumina, silica, and at least one of hydrated amorphous alumina and at least one of alkali metal oxide, alkali earth metal oxide, a metal halogen compound, metal sulfate, and metal perchlorinate.

When using a porous oxide which is a binary compound including hydrated amorphous alumina and porous silica, the porous material layer 17 can have a dual-layered structure including an alumina layer and a silica layer.

According to the present invention, at least one of alkali metal oxide, alkali earth metal oxide, a metal halogen compound, metal sulfate, and metal perchlorinate is captured within an alumina network or an alumina-silica network.

When forming the porous material layer 17 using hydrated amorphous alumina and silica, the hydrated amorphous alumina and the silica can be mixed in, but not limited to, a ratio of 0.01:1-1:1.

Examples of hydrated amorphous alumina include bohemite (AlOOH) and byerite ($AL(OH)_3$), which are monohydrated alumina.

Examples of the alkali metal oxide include lithium oxide ($Li2O$), sodium oxide ($Na_2O$), and potassium oxide ($K_2O$). Examples of the alkali earth metal oxide include barium oxide (BaO), calcium oxide (CaO), and magnesium oxide (MgO). Examples of the metal sulfate include lithium sulfate ($Li_2SO_4$), sodium sulfate (Nai2SO4), calcium sulfate ($CaSO_4$), magnesium sulfate ($MgSO_4$), cobalt sulfate ($COSO_4$), gallium sulfate ($Ga_2(SO_4)_3$), titanium sulfate ($Ti(SO_4)_2$), and nickel sulfate ($NiSO_4$). Examples of the metal halogen compound include calcium chloride ($CaCl_2$), magnesium 8 chloride, strontium chloride ($SrCl_2$), yttrium chloride ($YCl_2$), copper chloride ($CuCl_2$), cerium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$), and magnesium iodide ($MgI_2$). Examples of the metal perchlorinate include barium perchlorinate ($Ba(ClO_4)_2$) and magnesium perchlorinate ($Mg(ClO_4)_2$).

The porous material layer 17 can be formed using porous silica by applying a variety of methods, one of which is as follows.

First, a first mixture is prepared by mixing 0.3 g of a surfactant and 0.6 g of a solvent. Here, a polymeric surfactant is used, and a 1:2 mixture of propanol and butanol is used as the solvent. Next, a second mixture is prepared by mixing 5 g of tetraethyl orthosilicate (TEOS) and 10.65 g of a solvent, and 1.85 g of HCL.

After stirring the second mixture for about 1 hour, 2.1 g of the second mixture is mixed with the first mixture to obtain a third mixture. This third mixture is coated on a substrate to be used as the sealing member 13 using spin coating, spray coating, roll coating, etc. As an example, the third mixture can be spin-coated on the second substrate 12 with the color filter 20 at 2000 rpm for about 30 seconds. The resulting structure is aged at room temperature for 24 hours or at 40-60° C. for 5 hours and calcinated in an oven at 400° C. for about 2 hours to burn off the polymer and form absorption holes. As a result, a porous silica layer having a thickness of 7000 Å is formed. The above processes are repeated until a porous layer having a desired thickness is formed. The amounts of the materials used to form the porous layer are not absolute. Rather, the ratio of the materials should be fixed.

In another method, ammonia water ($NH_4OH$) is added to 30 g of $H_2O$ to provide alkalinity. 10 g of TEOS is added to the alkaline solution and heated for 3 hours or longer while stirring it for hydrolysis and polycondensation reactions. An acid, which can be organic or inorganic, is added to the resulting solution.

Next, 13.2 g of a water-soluble acrylic resin solution (30% by weight) is added to stabilize the resulting mixture and stirred to obtain a homogeneous solution.

This solution is spin-coated on the substrate to be used as the sealing member 13 at 180 rpm for 120 seconds and dried in a drying oven for about 2 minutes to remove the remaining unvaporized solvent. These processes are repeated to form a thicker porous layer.

Polymeric and organic substances are removed from the resulting structure and thermally treated at 500° C. for 30 minutes to harden the silica. The amounts of the materials used to form the porous layer are not absolute. Rather, the ratio of the materials should be fixed.

The porous silica layer formed using one of the above-described methods include absorption holes 17b in its structure, as illustrated in FIG. 2. The size of the absorption holes 17b can be in a range of 2-30 nm. The size of the absorption holes 17b can be varied by adjusting the molecular weight of the polymer used in the first mixture. The absorption holes 17b can occupy about 80% of the volume of the porous silica layer. As described above, the porous silica layer can be formed using spin coating, spray coating, roll coating, etc. The porous silica layer is mechanically and thermally stable. The porous silica layer can be manufactured using processes which are easy to control.

When using hydrated amorphous alumina, a porous oxide layer according to the present invention can be formed by coating and drying an alumina solution prepared by thermally processing a composition containing aluminum alkoxide and a polar solvent. The alumina solution can be coated using, but not limited to, spin coating, screen printing, etc. Examples of aluminum alkoxide that can be used include aluminum triisoproxide ($Al(OPr)_3$), aluminum tributoxide ($Al(OBu)_3$), etc. The polar solvent can be at least one of pure water, ethanol, methanol, butanol, isopropanol, and methylethylketone.

A hydrolytic catalyst, such as nitric acid, hydrochloric acid, phosphoric acid, sulfuric acid, etc., can be further added to the composition. Alternatively, polyvinyl alcohol, an antifoaming agent, etc., can be further added to the alumina solution if required. A detailed method of forming a porous oxide layer using hydrated amorphous alumina is as follows.

300 g of $H_2O$ is heated to 80° C., and 165.54 g of $Al(OPr)_3$ is added thereto and stirred for 20 minutes. 1.2 g of 30% hydrochloric acid (HCl) is added to the reaction mixture and heated to 95° C. and refluxed for 3 hours to obtain a transparent alumina solution.

60 g of $H_2O$ is added to 25 g of the transparent alumina solution and stirred for 20 minutes. 10 g of a 30% aqueous polyvinyl alcohol (PVA) solution (by weight, having a weight average molecular weight of 20,000) is added to the mixture and stirred for 20 minutes, and 5 g of an antifoaming agent is added to prepare a coating solution for a porous alumina layer.

The coating solution is spin-coated on a substrate to be used as the sealing member 13 at 180 rpm for 120 seconds and dried in a drying oven for about 2 minutes to remove the remaining unvaporized solvent. The resulting structure is thermally processed to form a porous alumina layer. These processes are repeated to form a thicker porous alumina layer. The amounts of the materials used to form the porous alumina layer are not absolute. Rather, the ratio of the materials should be fixed.

A method of manufacturing a porous material layer according to the present invention using a mixture of porous silica and hydrated amorphous silica is as follows.

As described above, a silica-forming composition containing silicon alkoxide and a polar solvent is added to an alumina solution prepared as described above. A porous oxide layer containing a mixture of alumina and silica can be formed from the mixture of the silica-forming composition and the alumina solution.

The silicon alkoxide used in the present invention has formula (1) below. Examples of the silicon alkoxide include tetraethyl orthosilicate (TEOS), etc.

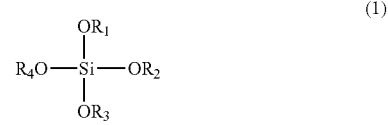

(1)

where each of $R_1$, $R_2$, $R_3$, and $R_4$ is independently a $C_1$-$C_{20}$ alkyl group or a $C_1$-$C_{20}$ or a $C_6$-$C_{20}$ alkyl group.

The polar solvent can be at least one of ethanol, methanol, butanol, isopropanol, methylethylketone, and pure water, as used in the preparation of the alumina solution. In addition, a hydrolytic catalyst, such as nitric acid, hydrochloric acid, phosphoric acid, sulfuric acid, etc., can be further added.

In particular, 10 g of TEOS is added to 30 g of $H_2O$ and 10 g of EtOH and stirred for 30 minutes or longer for hydrolysis reaction. $CaCl_2$ is added to the reaction product and dissolved to obtain a composition for a porous silica layer.

The resulting composition is spin-coated on a substrate to be used as the sealing member 13 at 180 rpm for 120 seconds and dried in a drying oven for about 2 minutes to remove the remaining unvaporized solvent. The resulting structure is thermally processed to form a composite porous oxide layer.

A method of forming a porous material layer having a structure in which at least one of alkali metal oxide, alkali earth metal oxide, a metal halogen compound, metal sulfate, and metal perchlorinate is captured in a porous hydrated amorphous alumina network is as follows.

A composition containing aluminum alkoxide and a polar solvent is coated on a surface of a substrate to be used as the sealing member 13 and thermally treated to form a porous oxide layer. As a result of hydrolysis and dehydrated polycondensation reactions, a porous alumina layer is formed.

The thermal treatment can be performed at 100-550° C. If the temperature is lower than 100° C., an organic substance such as solvent can remain within the layer. If the temperature is higher than 550° C., the glass substrate itself can deform.

The alumina forming composition can be coated using various methods, for example, but not limited to, spin coating, screen printing, etc.

Examples of the aluminum alkoxide that can be used include aluminum triisoproxide (Al(OPr)$_3$), aluminum tributoxide (Al(OBu)$_3$), etc. The polar solvent can be at least one of pure water, ethanol, methanol, butanol, isopropanol, and methylethylketone. The amount of the polar solvent can be in a range of 100-1000 parts by weight based on 100 parts by weight of aluminum alkoxide.

A hydrolytic catalyst, such as nitric acid, hydrochloric acid, phosphoric acid, sulfuric acid, etc., can be further added to the composition. The amount of the hydrolytic catalyst can be in a range of 0.1-0.9 moles based on 1 mole of aluminum alkoxide.

An additive, such as polyvinyl alcohol, polyvinyl pyrrolidone, polyvinyl butyral, etc. can be further added to the composition if required. Polyvinyl alcohol, polyvinyl pyrrolidone, and polyvinyl butyral improve porosity and coating property. The amount of the additive can be in a range of 1-50 parts by weight based on 100 parts by weight of aluminum alkoxide. A polyvinyl alcohol, a polyvinyl pyrrolidone, and a polyvinyl butyral having a weight average molecular weight of 5,000-300,000 can be used.

The alumina composition can further include at least one an alkali metal salt, an alkali earth metal salt, a metal halogen compound, a metal sulfate, and a metal perchlorinate. The amount of the alkali metal salt or the alkali earth metal salt can be in a range of 0.1-0.5 moles based on 1 mole of aluminum alkoxide.

When adding an alkali metal salt and/or an alkali earth metal salt to the composition, a porous oxide layer having a structure in which moisture-absorptive alkali metal oxide and/or alkali metal oxide is captured in a porous alumina is formed. The porous oxide layer having this structure has greater moisture absorbance than a porous oxide layer containing only porous alumina.

Examples of the alkali metal salt, which is a precursor of alkali metal oxide, include sodium acetate, sodium nitrate, potassium acetate, and potassium nitrate. Examples of the alkali earth metal salt include calcium acetate, calcium nitrate, barium acetate, barium nitrate, etc. The above-listed examples of the metal halogen compound, metal sulfate, and metal perchlorinate can be used.

A silica composition including silicon alkoxide and a polar solvent can be added to the alumina composition. When adding the silica composition to the alumina composition, a porous oxide layer containing a mixture of alumina and silica is finally formed.

As in the preparation of the alumina solution, the polar solvent can be at least one of ethanol, methanol, butanol, isopropanol, methylethylketone, and pure water. The amount of the polar solvent can be in a range of 100-1000 parts by weight based on 100 parts by weight of the silicon alkoxide.

A hydrolytic catalyst, such as nitric acid, hydrochloric acid, phosphoric acid, sulfuric acid, etc., can be further added to the composition. The amount of the hydrolytic catalyst can be in a range of 0.1-0.9 moles based on 1 mole of aluminum alkoxide. If the amount of the hydrolytic catalyst is less than 0.1 moles, the manufacturing time increases. If the amount of the hydrolytic catalyst is greater than 0.9 moles, it is difficult to control the manufacturing process.

The porous material layer 17, manufactured using one of the above-described methods, can have a thickness of 100 nm-50 μm. If the thickness of the porous material layer 17 is less than 100 nm, the porous material layer 17 cannot absorb moisture sufficiently to protect the OEL unit 12 from moisture. If the thickness of the porous material layer 17 is greater than 50 μm, it takes too much time to produce, thus lowering productivity.

The porous material layer 17 is formed so as not to contact the sealing portion 14. If the porous material layer 17 contacts an area where the sealant 15 is used for the sealing portion 14, the adhesion of the sealant 15 can decrease. By preventing adhesion deterioration to the sealing portion 15, moisture intrusion into the space region 10 and a fatal defect to the OEL unit 12 can be prevented and the OEL unit 12 can be effectively protected from external impact.

According to the present invention, to prevent adhesion deterioration of the sealant 15, the porous material layer 17 does not extend to the sealing portion 14. The porous material layer 17 can be larger than the OEL unit 12 for a larger moisture absorption area.

To prevent the porous material layer 17 from contacting the sealing portion 14, as shown in FIG. 1, an internal surface of the sealing member 13 opposite to the OEL unit 12 is recessed.

Corners of a recessed portion 16 can have right angles or be rounded although not illustrated. By forming the porous material layer 17 within the recessed portion 16, the porous material layer 17 and the sealing portion 14 are separated from each other.

Furthermore, when using the sealing member 13 with the recessed portion 16 in a front emission display emitting light toward the second substrate 12 or in a double-side emission display, a Moire phenomenon in the space region 10 can be prevented. The Moire phenomenon can occur in a front emission or double-side emission display, due to light interference, when a distance L between the OEL unit 12 and the porous material layer 17 in the space region 10, is as small as a few micrometers.

In general, when the distance L between the OEL unit 12 and the porous material layer 17 is as small as a few micrometers, it is difficult to accurately control the distance L in the manufacturing process. A minor inaccuracy in the distance L causes staining due to constructive inference of a particular wavelength, which results in a Newton ring that also contributes to the staining. Such staining caused by a Newton ring can be prevented by forming the recessed portion 116 in the sealing member 17 so that the distance L between the OEL unit 12 and the porous material layer 17 is greater than 10 μm. The distance L between the OEL unit 12 and the porous material layer 17 can be greater than 10 μm. If the distance L is greater than 1000 μm, the resulting display becomes too thick. Therefore, the distance L should be less than 1000 μm.

The distance L between the OEL unit 12 and the porous material layer 17 can be varied by controlling the depth of the recessed portion 16 from a top surface of the sealing member 13 and the thickness of the sealant 15 used for the sealing portion 14. When a glass substrate is used for the sealing member 13, the recessed portion 16 can be formed using etching.

Figure 3:
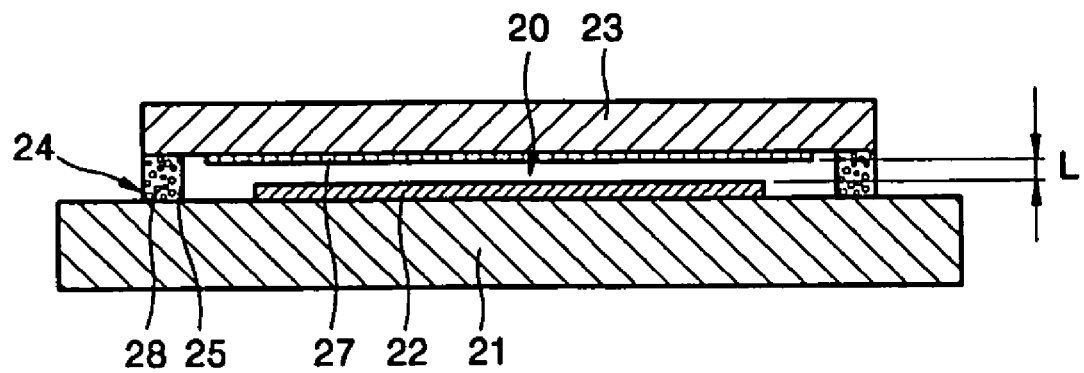
FIG. 3 is a sectional view of an OELD according to another embodiment of the present invention.

The above-described effects can be achieved by an OELD according to another embodiment of the present invention illustrated in FIG. 3. In particular, a porous material layer 27 made of porous oxide, which remains transparent after moisture absorption, is formed on an internal surface of a sealing member 23 and spaced a predetermined distance from a sealing portion 24, as shown in FIG. 3. In this embodiment, it is more effective that the porous material layer 27 is formed to be larger than an OEL unit 22. The distance L between the porous material layer 17 and the OEL unit 22 can be in a range of 10-1000 μm to prevent the Moire phenomenon, as described above. The distance L between the first and second substrates 11 and 12 can be controlled using spacers 28 contained in a sealant 25 forming a sealing portion 24. A substrate 21 and the OEL unit 22 are the same as in the embodiment described above, and thus descriptions thereof have not been repeated here.

Figure 4:
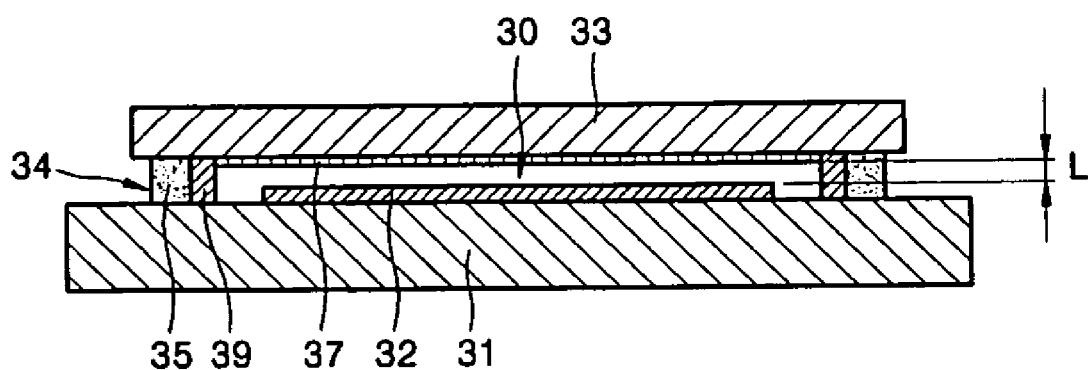
FIG. 4 is a sectional view of an OELD according to another embodiment of the present invention.

FIG. 4 is a sectional view of an OELD according to another embodiment of the present invention. In this OELD, a barrier wall 39 is formed between a porous material layer 37 and a sealing portion 34 so as not to contact each other. The distance L between the OEL unit 32 and the porous material layer 37 can be controlled to be 10-1000 μm by the barrier wall 39 to prevent the Moire phenomenon. The structures of a substrate 31, the OEL unit 32, a sealing member 33, and a sealing portion 34 are the same as in the embodiment described above, and thus descriptions thereof have not been repeated here.

An OELD with a porous material layer according to the present invention provides the following effects.

Since the porous material layer formed on an internal surface of a sealing member remains transparent even after moisture absorption, the OELD according to the present invention can be applied to both front emission and double-side emission OELDs, and the thickness of the OELD can be reduced.

Second, the porous material layer does not deteriorate the adhesion of a sealant, thus stabilizing the structure of the display.

Third, the porous material layer is properly spaced, thus preventing a Moire phenomenon.

Fourth, the porous material layer prevents intrusion of moisture as well as external air, thus extending the life span of the OELD.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. An organic electroluminescent display device, comprising:
   a transparent substrate;
   an organic electroluminescent unit arranged on a surface of the transparent substrate, and having a pair of opposing electrodes and an organic emissive layer adapted to emit light due to a recombination of electrons and holes supplied by the pair of opposing electrodes;
   a sealing member combined with the transparent substrate and adapted to transmit light emitted by the organic emissive layer to an exterior of the display device, and to protect the organic electroluminescent unit from external air and having a sealing portion along edges of the sealing member;
   a transparent porous material layer arranged directly on a surface of the sealing member opposite to the organic electroluminescent unit so as not to contact the sealing portion;
   the transparent porous material layer including a transparent material adapted to transmit light emitted by the organic emissive layer to the sealing member and to absorb moisture and to remain transparent even after absorption of moisture; and
   the transparent porous material layer including a porous oxide layer comprising one material selected from the group consisting of hydrated amorphous alumina; a binary compound of porous silica and hydrated amorphous alumina; a binary or higher compound including hydrated amorphous alumina and at least one of alkali metal oxide, alkali earth metal oxide, a metal halogen compound, metal sulfate, and metal perchlorinate; and a ternary or higher, multi-compound including hydrated amorphous alumina, silica, and at least one of hydrated amorphous alumina and at least one of alkali metal oxide, alkali earth metal oxide, a metal halogen compound, metal sulfate, and metal perchlorinate.

2. The organic electroluminescent display device of claim 1, wherein the sealing member has a recessed portion having a predetermined depth in the surface thereof opposite to the organic electroluminescent unit, and wherein the porous material layer is arranged within the recessed portion so as not to contact the sealing portion.

3. The organic electroluminescent display device of claim 1, wherein the porous material layer has an area equal to or greater than that of the organic electroluminescent unit.

4. The organic electroluminescent display device of claim 1, further comprising a barrier wall arranged between the sealing portion and edges of the porous material layer.

5. The organic electroluminescent display device of claim 1, wherein the sealing member includes at least one of a glass transparent substrate portion and a transparent plastic substrate portion.

6. The organic electroluminescent display device of claim 5, further comprising a waterproof transparent protective layer arranged on an internal surface of the transparent plastic substrate.

7. The organic electroluminescent display device of claim 1, wherein at least one of the opposing electrodes of the organic electroluminescent unit, arranged opposite to the sealing member, includes a transparent conducting agent.

8. The organic electroluminescent display device of claim 1, wherein the porous material layer consists solely of a porous oxide layer having a plurality of absorption holes.

9. The organic electroluminescent display device of claim 8, wherein the porous oxide layer has a thickness ranging from 100 nm to 50 μm.

10. The organic electroluminescent display device of claim 8, wherein the plurality of absorption holes of the porous oxide layer have a diameter ranging from 0.5-100 nm.

11. The organic electroluminescent display device of claim 1, wherein the sealing member includes a transparent substrate, and wherein the porous material layer is spaced a predetermined distance from the organic electroluminescent unit to prevent a moire phenomenon induced by light emitted from the organic electroluminescent unit.

12. The organic electroluminescent display device of claim 1, wherein the porous material layer is spaced at least 10 μm from the organic electroluminescent unit.

13. The organic electroluminescent display device of claim 12, wherein the porous material layer is spaced no greater than 1000 μm from the organic electroluminescent unit.

14. An organic electroluminescent display device, comprising:
   a transparent substrate;
   an organic electroluminescent unit arranged on a surface of the transparent substrate, and having a pair of opposing electrodes and an organic emissive layer adapted to emit light due to a recombination of electrons and holes supplied by the pair of opposing electrodes;

a sealing member combined with the transparent substrate and adapted to protect the organic electroluminescent unit from external air, the sealing member including a transparent material adapted to transmit light emitted by the organic emissive layer external to the display;

a transparent porous material layer arranged directly on a surface of the sealing member disposed opposite to the organic electroluminescent unit and spaced a predetermined distance apart from the organic emissive layer of the organic electroluminescent unit, and adapted to prevent a Moire phenomenon caused by light emitted from the organic emissive layer;

the transparent porous material layer including a transparent material transmitting light emitted by the organic emissive layer to the sealing member, and absorbing moisture and remain transparent even after absorption of moisture; and the transparent porous material layer including a porous oxide layer comprising one material selected from the group consisting of hydrated amorphous alumina; a binary compound of porous silica and hydrated amorphous alumina; a binary or higher compound including hydrated amorphous alumina and at least one of alkali metal oxide, alkali earth metal oxide, a metal halogen compound, metal sulfate, and metal perchlorinate; and a ternary or higher, multi-compound including hydrated amorphous alumina, silica, and at least one of hydrated amorphous alumina and at least one of alkali metal oxide, alkali earth metal oxide, a metal halogen compound, metal sulfate, and metal perchlorinate.

15. The organic electroluminescent display device of claim 14, wherein the surface of the sealing member opposite to the organic electroluminescent display includes a recessed portion, and wherein the porous material layer is arranged within the recessed portion.

16. The organic electroluminescent display device of claim 15, wherein the sealing member includes a transparent glass substrate portion, and wherein the recessed portion is etched into a surface of the glass substrate portion opposite to the organic electroluminescent unit.

17. The organic electroluminescent display device of claim 14, further comprising a barrier wall arranged between the sealing member and the substrate, the porous material layer being arranged on the sealing member inside the barrier wall.

18. The organic electroluminescent display device of claim 14, wherein the sealing member is combined with the substrate by a sealing portion formed along an edge of the sealing member, and wherein the sealing portion includes spacers adapted to control a distance between the porous material layer and the organic electroluminescent unit.

19. The organic electroluminescent display device of claim 14, wherein the sealing member is at least one of a transparent glass substrate portion and a transparent plastic substrate portion.

20. The organic electroluminescent display device of claim 19, further comprising a transparent waterproof protective layer arranged on an internal surface of the transparent plastic substrate.

21. The organic electroluminescent display device of claim 14, wherein at least one of the opposing electrodes of the organic electroluminescent unit, arranged opposite to the sealing member, includes a transparent conducting agent.

22. The organic electroluminescent display device of claim 14, wherein the porous material layer consists solely of a porous oxide layer having a plurality of absorption holes.

23. The organic electroluminescent display device of claim 22, wherein the porous oxide layer has a thickness ranging from 100 nm to 50 μm.

24. The organic electroluminescent display device of claim 22, wherein the absorption holes of the porous oxide layer have a diameter ranging from 0.5-100 nm.

25. The organic electroluminescent display device of claim 14, wherein the porous material layer is spaced at least 10 μm from the organic electroluminescent unit.

26. The organic electroluminescent display device of claim 25, wherein the porous material layer is spaced no greater than 1000 μm from the organic electroluminescent unit.

* * * * *